United States Patent [19]
Awaji et al.

[11] Patent Number: 5,654,655
[45] Date of Patent: Aug. 5, 1997

[54] DRIVER CIRCUIT FOR SEMICONDUCTOR TEST SYSTEM

[75] Inventors: Toshiaki Awaji; Masakazu Ando, both of Gyoda, Japan

[73] Assignee: Advantest Corporation, Tokyo, Japan

[21] Appl. No.: 451,430

[22] Filed: May 26, 1995

[30] Foreign Application Priority Data

May 27, 1994 [JP] Japan ................................ 6-138089
Dec. 15, 1994 [JP] Japan ................................ 6-333363

[51] Int. Cl.$^6$ .................................................. H03K 5/22
[52] U.S. Cl. ........................ 327/108; 327/70; 327/74
[58] Field of Search ........................ 327/69, 70, 74–76, 327/478, 108, 109

[56] References Cited

U.S. PATENT DOCUMENTS

| | | | |
|---|---|---|---|
| 5,465,059 | 11/1995 | Pan et al. | 327/74 |
| 5,488,322 | 1/1996 | Kaplinsky | 327/74 |
| 5,510,736 | 4/1996 | Van de Plassche | 327/74 |

*Primary Examiner*—Toan Tran
*Attorney, Agent, or Firm*—Knobbe, Martens, Olson and Bear, LLP

[57] ABSTRACT

A driver circuit for a semiconductor test system that can reduce power consumption significantly, set the power-supply voltage to low level, and can facilitate mearsurments against temperature increases. The invention is able to respond to higher amplitudes and high speeds in the semiconductor test system. The driver circuit provides an output for a semiconductor test system by switching the high and low voltage levels, and configuring a current-source device 703 to supply an output current at a period set by a switch. The invention also comprises a driver circuit that consumes less power by adapting a circuit that drastically reduces current consumption during no-load operation. To accomplish this, after receiving the positive differential-switching signal and negative differential-switching signal, the analog-voltage signal is supplied to an output-stage transistor by switching diode bridges. Output is provided by buffering and amplifying by means of forming a current mirror. Furthermore, the invention provides a driver circuit that reduces I/O spikes during the driver-inhibit mode. To achieve this, the high-level input-voltage VH is applied to the first switch terminal and the base-voltage VA of the first voltage-output device is applied to the second switch terminal. The control-current signal for the first current-source device is connected to the input terminal. This features prohibits the first current-source device from turning on until the voltage VA coincides with the high-level input-voltage VH. The same arrangement is made for the low-level side.

5 Claims, 12 Drawing Sheets

$VH + 2vf + VBE + \approx 2V = PV(+)$
$VL + 2vf + VBE + \approx 2V = MV(-)$ $VH + \approx 2V = PV(+)$
$VL + \approx 2V = MV(-)$

DRIVER CIRCUIT FOR SEMICONDUCTOR TEST SYSTEM

FIELD OF THE INVENTION

This invention relates to a driver circuit for a semiconductor test system that consumes reduced levels of power and is able to respond to high amplitudes and high speeds in a semiconductor test system. In addition, it relates to an N-branch driver circuit that drives the input pins of a device to be tested. Furthermore, it relates to an I/O spike-reduction circuit that reduces I/O spike output significantly while operating in the driver inhibit mode.

BACKGROUND OF THE INVENTION

In a semiconductor test system, a driver circuit is provided for each test pin of a device under test to supply the test signal with variable slew rates and voltage levels to the test pin. Typically, the driver circuit receives an input test signal and high and low reference voltages and generates an output test signal having the voltage levels defined by the reference voltages.

A prior art driver circuit is shown in FIG. 11. The driver circuit in FIG. 11 is designed to drive the input pins of a device to be tested. As this driver circuit is divided into a switching-circuit section 611 and output buffer section 612, there are various circuit stages. Furthermore, there is always current flowing in each circuit section. In addition, output current from this driver circuit always flows as an output idling current, even in the steady state. For this reason the circuit of FIG. 11 is limited in its ability to satisfy specifications required for handling high amplitudes and high speeds while achieving low power consumption.

Another example of the prior art is a two-branch driver circuit formed on a monolithic IC. This circuit is explained by referring to FIGS. 8, 9 and 10. The two-branch driver circuit is used where multiple devices are tested simultaneously in a semiconductor test system. It supplies the desired amplitude to the input pins of two devices (DUT) to be tested by receiving one test-pattern signal.

The circuit comprises a level-conversion circuit 200, first driver circuit 300, and second driver circuit 350. Here, the first driver circuit 300 and second driver circuit 350 are identical. The operation of the level conversion circuit 200 is described below:

The level-conversion circuit 200 supplies a voltage signal DR to the two-driver circuit in response to the conditions of 1) differential pattern signals PAT and NPAT, 2) an analog voltage signal VH that determines the high-level voltage of the driver output, 3) an analog voltage signal VL that determines the low-level voltage, 4) an analog control signal TRC that determines the rise time, and 5) an analog control signal TFC that determines the fall time.

The level-conversion circuit 200 comprises level-shift section 220, constant-current sections 201 and 203, switching sections 202 and 204, and diode bridges (DB) 231 and 232 as shown in FIG. 9.

A power supply VCCA1 is a positive power supply, for example, +11 V. In addition, a power supply VEEA 1 is a negative power supply, for example, −6 V.

After receiving the differential signal PAT and NPAT at the ECL level, the level-shift section 220 outputs differential signals Henb1, Lenb1, Henb2, and Lenb2 which are level-converted to the switch section 202 on the positive power-supply side and the switch section 204 on the negative power-supply side in order to switch DB231 and DB232. This internal circuit and its operation are described later on.

The switch section 202 and switch section 204 comprise a complementary circuit, and operating both sections switches either DB231 or DB232 and outputs analog voltages VH or VL to the output terminal DR.

When the differential switching signals Henb1 and Lenb1 are received from the level-shift section 220, and when Henb1 <Lenb1, PNP transistor Q283 side becomes conductive, the switch section 202 supplies current i91, which biases DB231 in the forward direction. Conversely, when Henb1>Lenb1, the Q284 side of PNP transistor becomes conductive and supplies current i92, which biases DB232 in the forward direction. The value of the bias current i91 is determined by either the relationship between resistor R274 on the switching section 202 side, voltage Henb1 and VCCA1, or the relationship between resistor R275 on the switching section 204 side, voltage Henb2 and VEEA1.

When Henb2>Lenb2, PNP transistor Q205 becomes conductive, the switch section 204 sinks current i91 from DB231, and switches on DB232 along with the said Q283. Conversely, when Henb1<Lenb1, the NPN transistor Q206 becomes conductive and switches on DB232 along with the said Q284. As a result, either DB231 or DB232 are switched on.

The analog voltage signal VH or VL is a constant analog voltage that determines a high level or low level of the driver output terminal out1, for example, voltage applied to the input pins of TTL- and ECL-compatible devices.

DB231 and DB232 produce output by switching either the analog voltage signal VH or VL. These devices for high-speed analog switches by building a bridge connecting eight diodes. The analog-voltage signal VH is supplied to the output terminal DR for DB232 while the analog-voltage signal VL is supplied to the output terminal DR for DB232.

More particularly, when bias current in the forward direction flows into the upper and lower two terminals of the diode bridge DB231 or DB232 as shown in FIG. 9, the state across the left-right terminals becomes an equivalent on stage, whereas when the bias current is absent it becomes an off stage. Hence, VH and VL analog signals can be switched at high speeds without being affected by the voltage on the bias-current side by using the composition of constant-current circuits of the switching sections 202 and 204.

Diodes used for this purpose can be a Schottky diode or a diode formed by connecting the base and collector of a transistor. Generally, when forming diodes on a monolithic structure, it is desirable to form a diode using a transistor because the area of the chip can be reduced. Furthermore, the Schottky diode has an advantage with respect to the reversed breakdown voltage, and it may be used separately or in combination depending on power-supply voltages, etc.

When DB231 and DB232 are in an off stage and a potential across the upper and lower terminals of these devices is in an indeterminate state, the high-speed switching operation of the constant-current sections 201 and 203 can be troublesome during the next switching transition. For this reason it is intended to make the potential anything other than an indeterminate state by applying extremely small current.

The circuit operation of the level-shift section 220 is described below.

The circuit composition of the level-shift section 220 is a bias-voltage supply section 221, differential amplifiers 222 and 224, and differential-current control sections 223 and 225 as shown in FIG. 10.

Differential voltages PAT and NPAT at the ECL level are input to the two differential amplifiers 222 and 224. First, the PAT and NPAT signals are input to the bases of Q10 and Q11 of the differential amplifier section 222 of NPN transistor, and differential switching signals Henb1 and Lenb1, which are shifted to a positive voltage level on the collector side are output. The differential current control section 223 is connected on the emitter side of the differential amplifier section 222.

This differential-current amplifier section 223 receives a constant voltage from the bias-voltage supply section 221 and forms a constant-current circuit with transmitter Q12, and resistors R9 and R8. In addition, the constant current can be made variable by altering the external voltage signal TRC through R8. In this way, output amplitudes of the switching signals Henb1 and Lenb1 can be variable and the transition time of a waveform on the rising side of the output signal out1 output by the driver circuit can be controlled continuously.

Secondly, the PAT and NPAT signals are input to the bases of Q14 and Q15 of the differential-amplifier section 224 of NPN transistor. Output differential-switching signals Henb2 and Lenb2 are thereby shifted to a negative-voltage level on the collector side. A differential-current control section 225 is connected on the emitter side of the differential-amplifier section 224, and similar to the above description, the constant current can be made variable by altering the external voltage signal TFC through R10. In this way, the transition time of a waveform on the rising side of the output signal out1 can be controlled continuously.

The operation of the first driver circuit 300 is described by referring to FIG. 8.

The first driver circuit 300 is composed of constant-current sources 311 and 312, PNP transistors Q381 and Q384, NPN transistors Q382 and Q383, diodes D391 and D392, and resistors R386 and R387. In this circuit, circuit elements not directly related to power consumption are omitted.

A power supply VCCA2 is a positive power supply similar to the power supply VCCA1, and a power supply VEEA2 too is a negative power supply similar to the power supply VEEA1.

The driver circuit 300 receives the analog voltage signal DR of VH/VL amplitudes described in the above level-conversion circuit 200, and it is a high-speed analog buffer circuit that supplies maximum load current of +/− Imax by converting to a low impedance of less than 50 ohms. Because it either supplies a source current to the load or forces a sink current from the load side to flow in, it is composed of a complementary circuit. In addition, an overshoot/undershoot voltage waveform caused by a reflection from the load side needs to be absorbed.

For this reason both the complementary transistors Q383 and Q384 in the output stage are always biased to the A-class operation state. Hence, both the transistors always drive the maximum load current Imax, even when external input and output currents are absent. A potential difference across resistors R386 and R387 is always constant, and the potential is given by a voltage determined by the potential difference of diodes D391 or D392.

The constant-current sources 311 and 312 flow at a constant current such that at least transistors Q383 and Q384 can drive the maximum load current Imax.

The analog voltage signal DR is input to the corresponding bases of Q383 and Q384 after being input to the bases of Q381 and Q382, emitter-followered, and providing the offset of the voltage of diodes D391 and D392. Here, since a potential difference between the bases of Q383 and Q384 is provided by a fixed-potential difference by using two diodes and two voltage Vbe, the output-stage transistor always performs the A-class operation. Thus, an output voltage corresponding to the input analog voltage signal DR is output.

As explained above, in the circuit configuration of the driver circuit, both the output stage transistors Q383 and Q384 are required to provide the maximum load current Imax all the time. Hence, the driver circuit 300 always consumes the maximum power regardless of the loading condition, and has a limitation in terms of reducing power consumption without degrading the switching speeds.

For this reason, a semiconductor test system that uses hundreds of channels with this driver circuit, requires cooling system that becomes bulky. Furthermore, such a system is subject to a limitation of high-density implementation, or a power supply with a large capacity is required, which leads to a large test system. Hence, this type of system is undesirable. Furthermore, the power-consumption reduction is limited by this circuit method.

There were such disadvantages with this type of system that it required a ceramic package as a container housing a monolithic IC, which had high radiation ability and was expensive, and this system was difficult to house in an inexpensive plastic package.

As another example of the prior art technology, a driver circuit with the driver-inhibit ability is shown in FIG. 12.

As shown in FIG. 12, the driver-inhibit circuit is arranged on the VH and VL sides. The VH side is explained first, but the VL side operates in the same manner.

Normally, the clamp voltage Pclmp 651 is set to a higher voltage than the maximum driver voltage set to VH 603. For this reason, diode 751 is in a cut-off state during ordinary driver output. The base voltage VA of transistor 702 becomes a value that is the sum of a voltage across the base-emitter of transistor 701 and a voltage in the forward direction of diode 901 subtracted from the VH. As a result, the driver output 615 becomes the VH.

A DRE 2 signal 682 is set to logic "1" during the driver-inhibit operation. Hence, a base current of transistor 702 is supplied from the power voltage PV 621 through transistors 854 and 855. Diodes 751 and 764 are turned on and the base-potential VA of transistor 702 reaches the clamp voltage Pclmp 651. Hence, transistor 702 is cut off.

At the same time, the high-level setting signal DH1 is set to logic "0." As a result, transistor 708 is also cut off. Similarly, as transistor 802 and 803, too, are cut off on the VL side, the driver output 615 becomes a high-impedance state.

The time chart of the third embodiment of this invention is illustrated in FIG. 4. As shown in FIG. 4a, the driver changes from an on period to an off period, i.e. the driver-inhibit period, then it changes back to an on period.

The voltage VA, as shown in FIG. 4b, varies from the driver voltage VH to the clamp voltage Pclmp, and this amplitude is relatively large. Hence, its transition time is not negligible. Especially, it is important when the driver changes from the inhibit state to an on state. That is, as shown in FIG. 4e, it would take time Ton for the base voltage VA of transistor 702 to change from the clamp voltage to the VH potential. On the other hand, when the high-level setting signal DH1 of the driver is set to logic "1," a voltage across resistor 709 is dropped immediately through transistor 704, as a result transistor 703 is turned on immediately. By this event transistor 702 is turned on, and the base-voltage VA appears at the driver output 615 as it is.

Therefore, as shown in FIG. 4a, a transition voltage due to the transistor switching to an on state is outputted to the driver output 616 as a spike waveform, and this spike is maintained as an I/O spike during a period of Ton.

In this way, the longer the transition period, the greater the I/O spike width and amplitude. This has an undesirable effect on DUT.

SUMMARY OF THE INVENTION

The first objective of this invention is as follows:

In the prior art, in order to perform at higher amplitudes and higher speeds, there was always idling current flowing in the output section of the driver circuit to increase or decrease the switching voltage in a shorter period. The reason for this is that as there exists elements' parasitic capacitance or stray capacitance, there is extra current drawn. There is always current flowing in the output section in advance in order to reduce the time needed to reach the switching setting value during an increase.

Since prior art circuits consume a significant amount of power, they not only require heat dissipation and cooling to resolve temperature increases, but they also have reduced power consumption as the whole driver circuit. It has therefore been difficult to achieve reductions in operating costs. Hence, the objectives of this invention are to realize a driver circuit that can reduce power consumption significantly in comparison with the prior art, be able to set the power-supply voltage to a low voltage, and can facilitate measures directed against temperature increase.

According to the first embodiment of this invention, in the driver circuit outputting to the output terminal 615 for a semiconductor test system, by switching the high level and low level, an output-current source device 703 is arranged to supply an output current and a period set by the current switch. The first voltage-buffer device 701 outputs with an emitter-follower under a given high level input voltage 603. The first voltage-output device 702 is provided, having a base ground that is determined by an output potential by the first voltage-buffer output value corresponding to the first current-source output. This device is equipped with a high-level amplifier 613 that is produced from the above configuration.

Furthermore, the second current-source device 803 is provided, which supplies an output current and a period set by the current switch. The first voltage-buffer device 801, outputs with an emitter-follower under a given high level input voltage 604. The first voltage-output device 802 is provided, having a base ground, which is determined by an output potential by the said first voltage-buffer output value corresponding to the said first current-source output. A low-power driver circuit for the semiconductor test system comprises a low-level amplifier 614 produced from the above configuration.

The following may be added to the above driver circuit. Detection devices (704, 705, 706, 707, 708) that detect changes in the output current of the output terminal 615. The low-power-consumption driver circuit for a semiconductor test system is formed by arranging a feedback-control device 709 that controls the current value of the current-source device 703 according to the detected value.

In addition the following may be added to the above driver circuit. The low-power-consumption driver circuit for a semiconductor test system is formed by arranging a clamp device 710 that obtains a constant and minimum current-source value according to the detected value.

According to the second embodiment of this invention, first, when Henb1<Lenb1, NPN transistor Q83 side becomes conductive and supplies current i6 to diode bridge DB71 by receiving positive differential-switching signals Henb1 and Lenb1. Secondly, when Henb1>Lenb1, the Q84 and Q85 side of PNP transistors becomes conductive and a positive-voltage switching section 511 is provided, which supplies current i2 to diode bridge DB72 and current i3 to the output driver section 520 with a collector current ratio of M to 1 by forming a current mirror with the two PNP transistors.

When Henb2<Lenb2, NPN transistor Q106 side becomes conductive and current i2 from diode bridge DB72 is sunk by receiving negative differential switching signals Henb1 and Lenb1. Secondly, when Henb2>Lenb2, the Q104 and Q105 side of NPN transistors becomes conductive and a negative-voltage switching section 511 is provided, which sinks current i7 from the output-driver section 520 and current i8 from diode bridge DB71 with a collector current ratio of M to 1 by forming a current mirror with the two NPN transistors. By receiving analog voltage signal VH providing a high level at the output terminal out1, a signal switched from the analog voltage signal VH by the positive-voltage switching section 511 and the negative voltage switching section 512 is taken from a tap position shifted by one diode D16 composing the bridge, and is supplied to the base of NPN transistor Q112 of the output driver section 520. The bridge DB71 consisting of at least eight diodes is provided.

By receiving the analog-voltage signal VL providing a low level at the output terminal out1, a signal which is switched from the analog-voltage signal VL by the negative-voltage switching section 511 and the negative voltage switching section 512 is taken from a tap position shifted by one diode of the diodes D27 composing the bridge, and is supplied to the base of PNP transistor Q113 of the output driver section 520. The bridge DB7 consisting of at least eight diodes is provided. Firstly, an output terminal from diode bridge DB71 and an current i3 output terminal from the positive-voltage switching section 511 are connected together. Secondly, an output terminal from diode bridge DB72 and current i8 output terminal from the negative-voltage switching section 512 are connected together. Then a bias potential having the potential difference 2xVbe between two bases and emitters of NPN transistor Q107 and PNP transistor Q108, is generated by the current i3≅i8 flowing between both the input terminals. The A-class bias is provided to the complementary composition of NPN transistor Q112 and PNP transistor Q113. The output driver section 520 is provided, which outputs to the output terminal out1 after buffering and amplifying the analog voltage signals VH and VL.

In this way a low-power driver circuit can be realized that selects VH or VL, buffers, amplifiers and outputs after receiving the positive-voltage differential-switching signals Henb1 and Lenb1, negative-voltage differential-switching signals Henb2 and Lenb2, and analog voltage signal VH, which determines a high level of the output terminal out1 and analog voltage signal VL, which determines a low level.

In addition, in the driver circuit of the above device, NPN transistors Q107 and Q112 are provided, having a chip size that provides a collector-current ratio of Q107:Q112=1:P by forming a current mirror with two transistors Q107 and Q112. Also, PNP transistors Q108 and Q113 are provided, having a chip size that provides a collector-current ratio of Q108:Q113=1:P by forming a current mirror with two transistors Q108 and Q113. In this way, the A-class bias condition for the output-stage transistors Q112 and Q113, which delivers stable low-power current, is readily provided.

Furthermore, there is a device composing an N-branch driver circuit provided by: arranging N sets of the driver circuit of the above device; arranging a level-shift circuit 400 that supplies differential-switching signals Henb1 and Lenb1 shifted to a positive voltage level and differential-switching signals Henb2 and Lenb2 shifted to a negative voltage level to the input terminal of the low-power driver circuit of the above device with the receipt of the PAT and NPAT signals; supplying an output signal from the level-shift circuit 400 to N sets of the driver circuit. In this way a low-power driver circuit with two branches through N branches can be realized.

In addition there is a composition where the constant-current section 501 and constant-current section 502, which provide minute current to the side where diode bridges DB71 and DB72 are in an off state, is added to the driver circuit of the above composition.

In addition, there is a composition where the current limiting section 50, which prevents excessive current on the positive power-supply side in the collector of the output stage NPN transistor Q112, and the current control section 51, which prevents excessive current on the positive power-supply side in the collector of the output stage PNP transistor Q113, are added to the driver circuit of the above composition.

The system of the present invention can realize a driver circuit with no wave distortions like those of the prior art circuits, because each pair of Q112/Q107 and Q113/Q108 forms a current mirror and the A-class bias condition is formed on output-stage transistors Q112 and Q113 by providing a bias potential of 2xVbe. This bias potential is provided by connecting the base and collector of NPN transistor Q107 or PNP transistor Q108 of the output driver section 520, and connecting both the emitters and getting constant-current i12 flow.

During the transition period when the output terminal out1 has not reached VH/VL level, because a potential at either the A or B points gets shifted, the potentials of DB71 and DB72 become unbalanced and current i6 or i4 plays a role of contributing as the drive current of the output-stage transistor Q112 and Q113.

Through these measures the second embodiment of this invention can realize a high-speed driver circuit equivalent to the traditional driver circuit, even when the consumed current during the steady state is reduced to roughly 1/M.

In addition another objective is to realize a driver circuit that possesses an I/O spike-reduction circuit that can significantly reduce I/O spike output during the driver-inhibit operation.

According to the third embodiment of this invention, switching devices (758, 760) are arranged before a current-source device stage 703 that supplies output current. Transistors 758 and 760 form a common emitter circuit, and high-level input voltage is applied to the base of transistor 758. In addition, an output voltage from a voltage-buffer device 701 is applied to the base of transistor 760. The collector of transistor 758 is connected to a load resistor 709. The common emitter of transistors 758 and 760 is connected to the collector of the base-grounded transistor 704. In this way, the switching device (758, 760) satisfies a condition by the I/O spike-reduction circuit after transition time Ton, and the current-source device 703 is turned on. Then a driver output 615 from a voltage output device 702 is output, and the inhibit mode is changed to the regular driver-output mode. When the current-source device 703 is turned on, input voltage VA of the voltage output device 702 is sufficiently dropped to a high-level input voltage VH from the clamp voltage Pclmp, and the spike width of the driver-output voltage appearing as an I/O spike is significantly reduced in comparison with the traditional technology.

DETAILED DESCRIPTION OF THE INVENTION

The first embodiment of this invention is described by referring to the figures.

Figure 1:
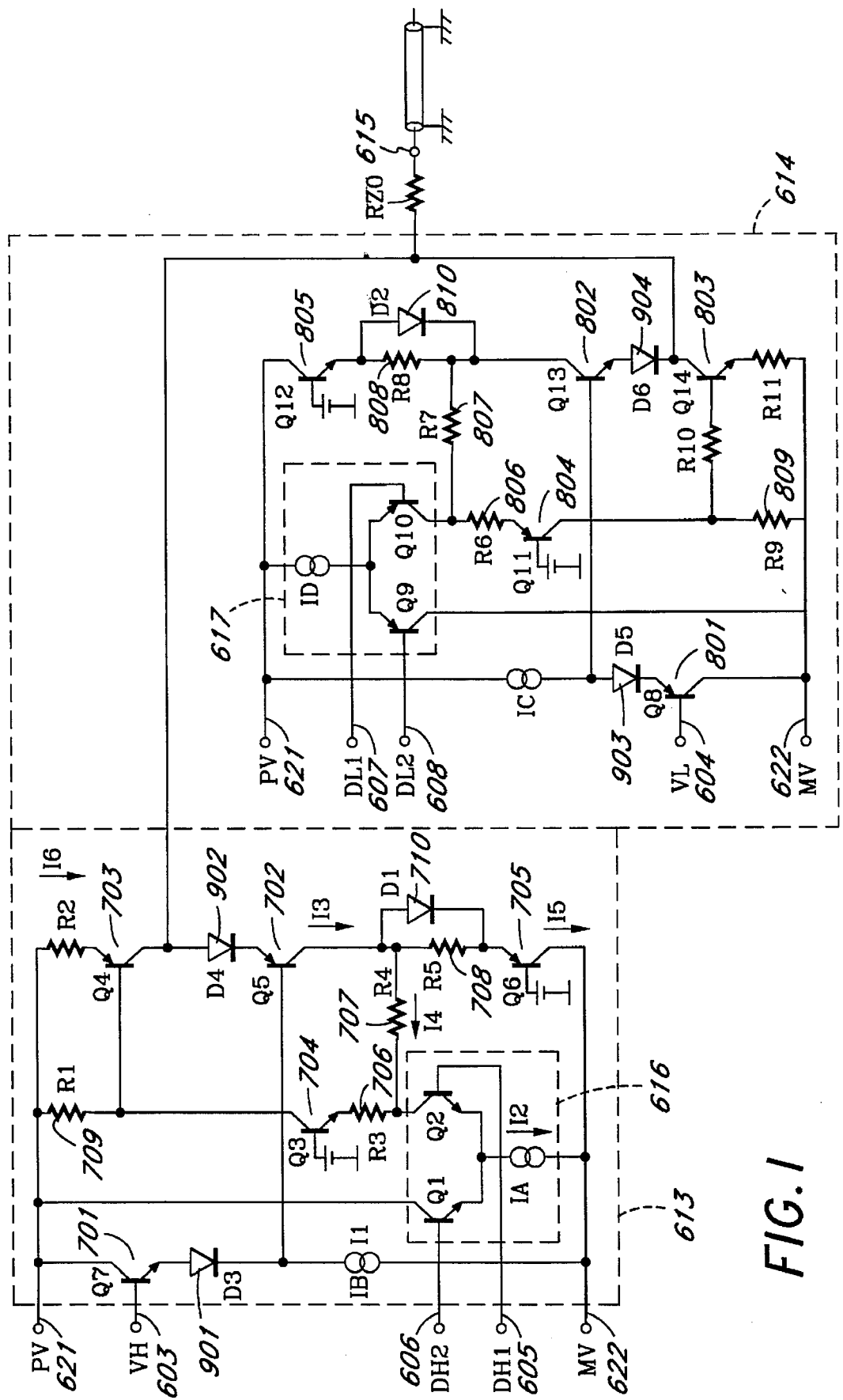
FIG. 1 is a schematic diagram illustrating a driver circuit of the first embodiment of this invention.

FIG. 1 illustrates a conceptual schematic of the driver circuit of the present invention. The driver circuit shown in FIG. 1 combines a switching-circuit section 611 and output-buffer section 612 into one and produces a VH amplifier 611 outputting a high level and a separate VL amplifier 614 outputting a low level the driver circuit of FIG. 1. The driver circuit also controls DH1.605, DH2.606 and DL1.607, DL2.608 by a logic signal, and provides either high-level output or low-level output by switching.

1. When the VH amplifier 613 is off, that is, when the VL amplifier 614 is outputting the low level, the following operations are performed:

a. When Q1 of the VH amplifier 613 is ON, Q2 is turned off and i2 flows into Q1.

b. When an emitter potential V1 is denoted as Q3 and an emitter potential V2 is denoted as Q6, then current of $(V1-V2)/(R3+R4+R5)$ flows through R1. Because this current is minute, but sufficient enough to keep Q3 and Q6 from being turned off, and the potential by R1 is small, for example, approximately less than 0.3 V, the current source of Q4 is turned off.

c. For this reason, the emitter of Q5 and diode D4 are dropped to a low level, and Q5 and D4 are cut off. As a result, the current i8 becomes zero. Note that diode D3.901 and diode D4.902 are Schottky barrier diodes for protecting the base and emitter breakdown voltage (BV EBO) of transistor Q7.701 and transistor Q5.702. In addition, diode D5.903 and diode D6.904 are Schottky barrier diodes for protecting the base and emitter breakdown voltage (BV EBO) of transistor Q8.801 and transistor Q13.802.

2. Next, when the VH amplifier 613 is on, that is, when the low level is switched to the high level, the following operations are performed:

a. When Q1 of the VH amplifier 613 is off, Q2 is turned on and i2 flows from Q1 to R3, Q3, and R1.
   b. The potential of i2xR1 is applied to the base of Q1, Q4 is turned on and current flowing into the driver output 615 starts raising the driver-output potential. At this occurrence, the VL amplifier 614 is turned off.
   c. The output potential continues to rise until base-grounded transistors Q5 and D4 are turned on. When Q5 and D4 are turned on, current i6 of the current source of Q4 flows into Q5 and D4, and flows separately through R4 and R5.
   d. Current i4 flowing into R4 reduces current flowing through R1, i.e., reduced to (I2–I4), and reduces current in the current source of Q4.

Items c and d of the above (2) indicate that a feedback loop is employed, and while it continues rising to the set output potential, the entire current i2 flows through resistor R1 during this period. However, when a steady-state condition with respect to the setting output potential is detected, it is fed back through R4 and the current flowing through R1 is reduced. That is, a dynamic current increases during the transient when the low level is switched to the high level, and if the VH amplifier 613 is settled at the set potential value of VH.603, the said current is reduced.

Figure 2A:
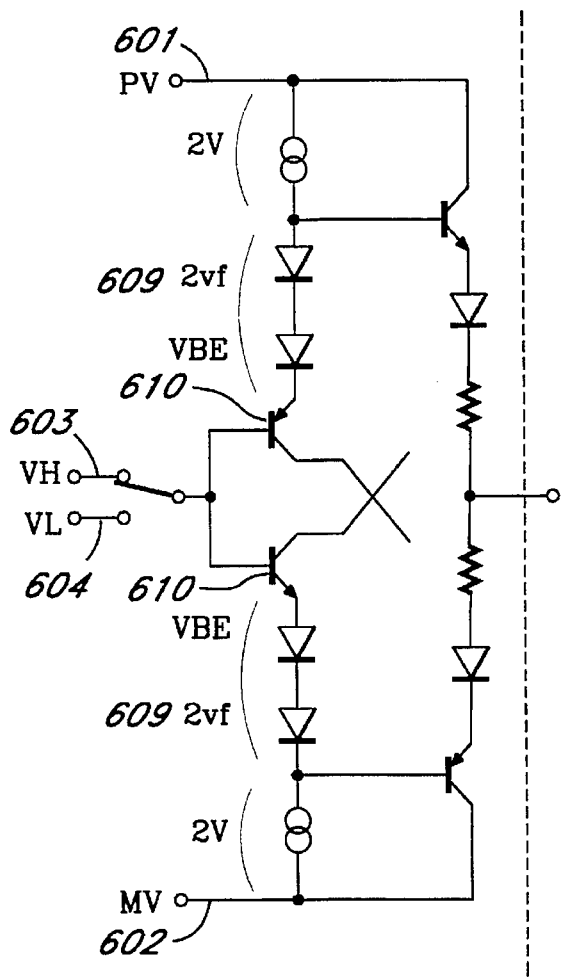
FIG. 2A is a schematic diagram illustrating current/voltage in a prior art driver circuit.
Figure 2B:
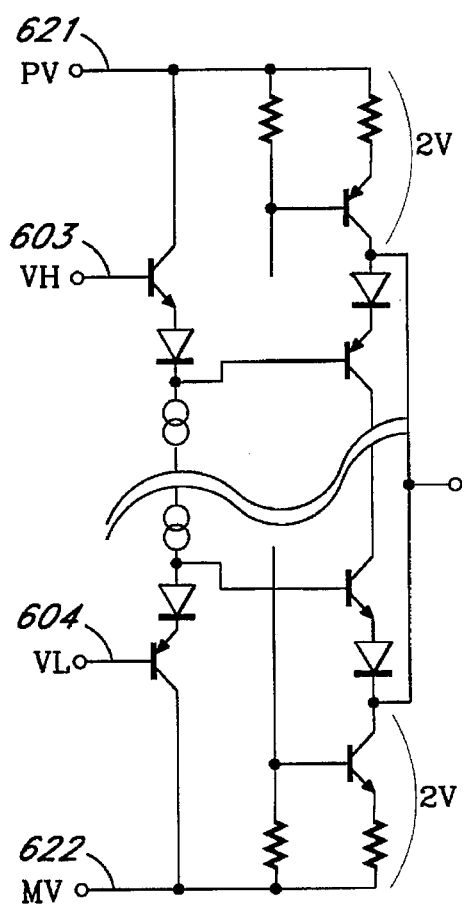
FIG. 2B is a schematic diagram illustrating a driver circuit of the first embodiment of this invention.

Next, in FIG. 2, the driver circuit of FIG. 2B demonstrates how it can set the power-supply voltage low in comparison with the driver circuit of the prior art of FIG. 2B. FIG. 2A is the driver circuit of this invention, and in the circuit configuration, PV621, which is the positive power supply, and MV622, which is the negative power supply, do not require the voltage section corresponding to (2 vf. 609+ VBE.610) as does the prior art. Hence, the power-supply voltage can be set lower, but the required voltage amplitudes for both the methods are identical.

The first embodiment of this invention, since it has the configuration explained above, has the effects mentioned below:

In the structure of the driver circuit of the first embodiment of this invention, the VH amplifier outputting the high level and VL amplifier outputting the low level are divided, the high-level and low-level outputs are separated by a logic signal, and as the driver circuit is designed to switch the high and low level by a logic signal, power consumption during the steady state, excluding dynamic current at switching from the high level to the low level or vise versa, can be greatly reduced as a whole.

Furthermore, the power-supply voltage can be set low in comparison with the traditional technology due to the composition of the driver circuit of the first embodiment of this invention.

In addition, by the reduction of power consumption, the measures to minimize temperature increases can be readily implemented, and the reduction of operating costs can be achieved.

The second embodiment of this invention is explained by referring to the figures.

Figure 5:
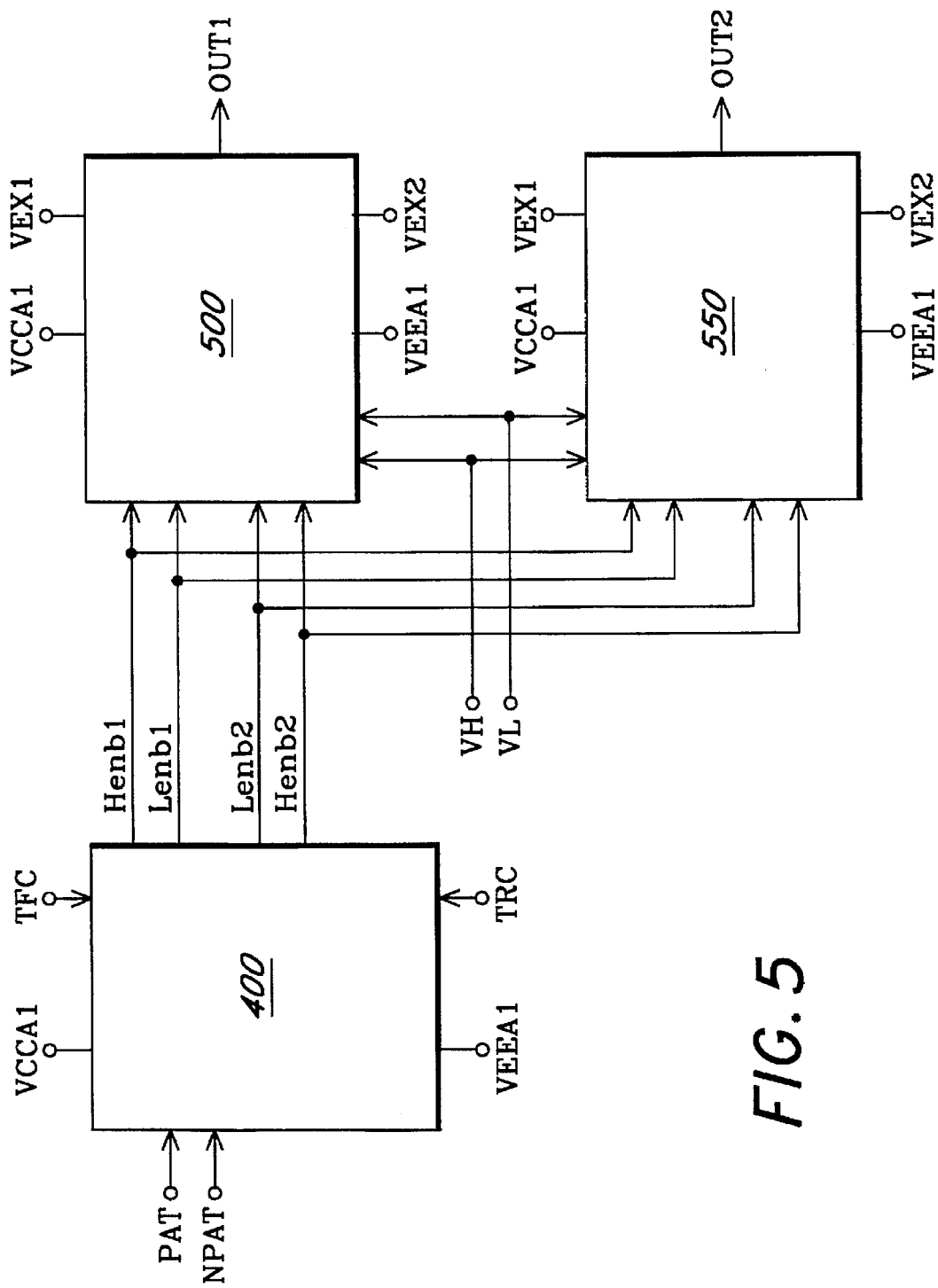
FIG. 5 is a block diagram illustrating a low-power two-branch driver circuit of the second embodiment of this invention.
Figure 6:
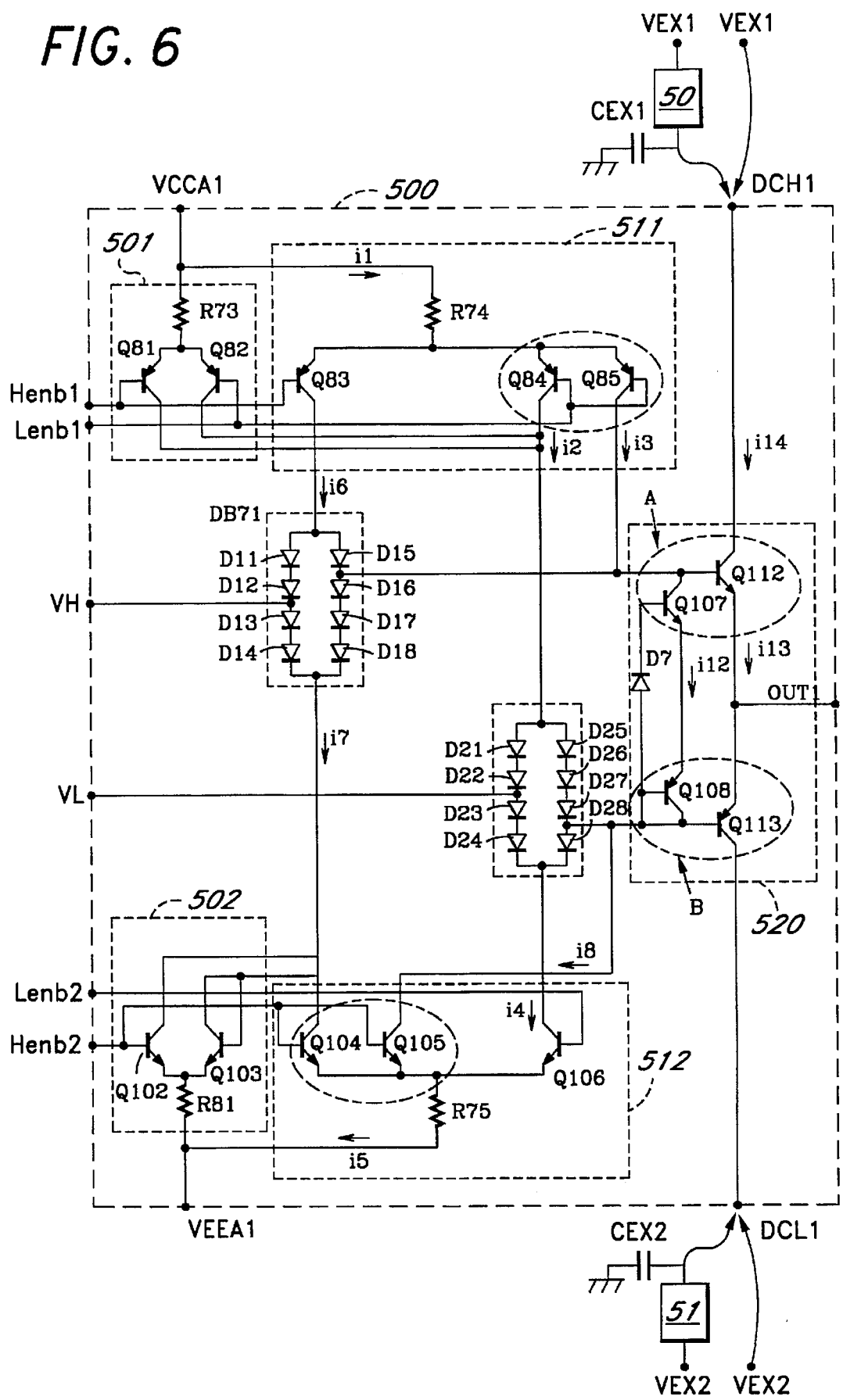
FIG. 6 is a schematic diagram illustrating the low-power first driver circuit of the second embodiment of this invention.

In particular, another preferred embodiment of this invention is best understood by reference to FIG. 5 and 6 which illustrates a low powered two-branch driver circuit formed on a monolithic IC.

In the circuit of this invention, two transistors with the composition of a current mirror are arranged for each complementary driver-output stage. One of these transistors is used to drive an output while the other transistor is used for a bias only. In this way, by eliminating a resistor at the emitter of the output stage, a stable bias is provided during the steady state and transition. A circuit was designed so that the output stage transistor can be driven with a large current. Through this circuit method current consumption is greatly reduced during the steady state.

The circuit structure, as shown in FIG. 5, is the level-shift circuit 400, the first driver circuit 500, and the second driver circuit 550. The first driver circuit and second driver circuit are identical.

Figure 10:
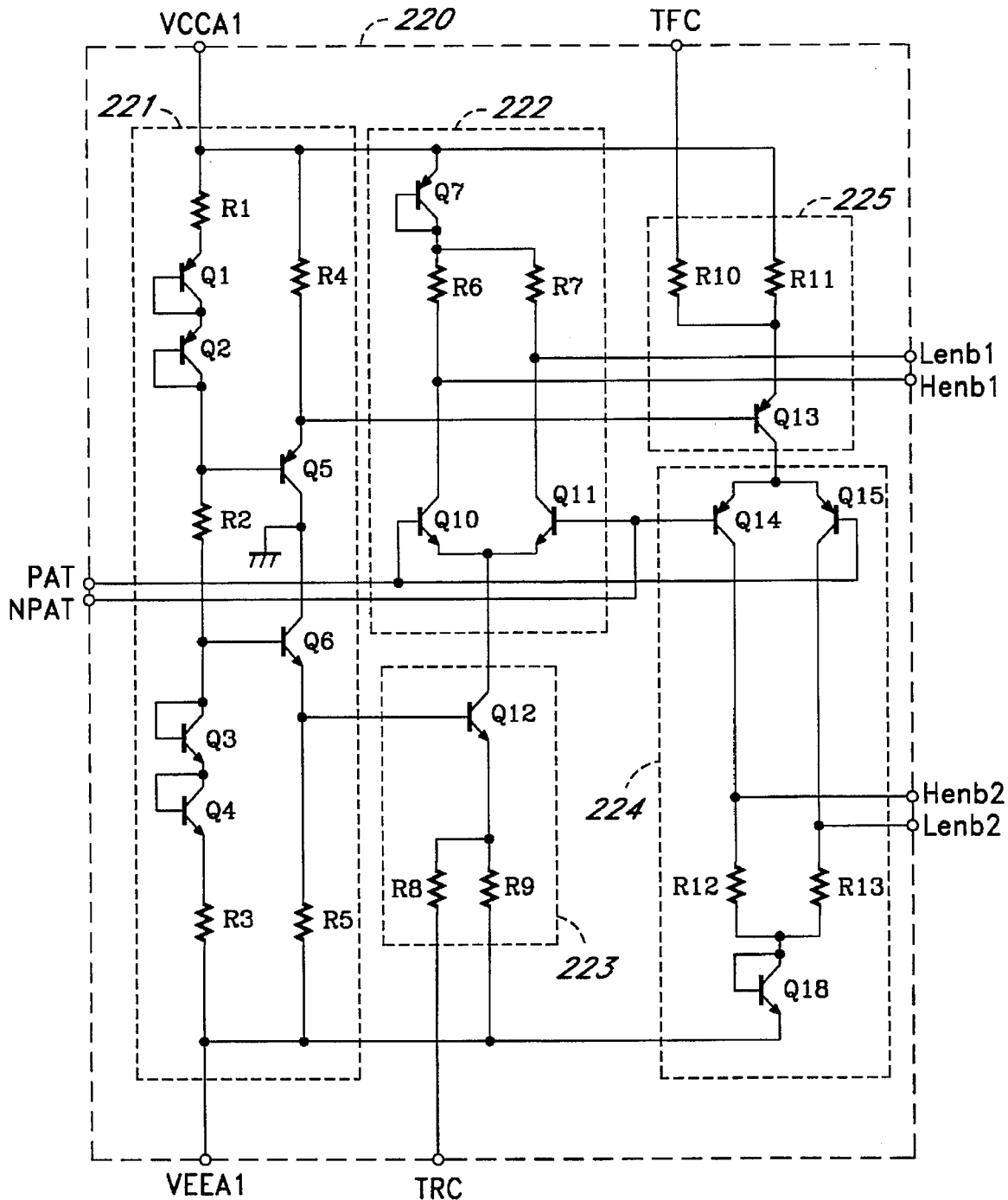
FIG. 10 is a schematic diagram illustrating a circuit of a prior art level-shift section.
Figure 11:
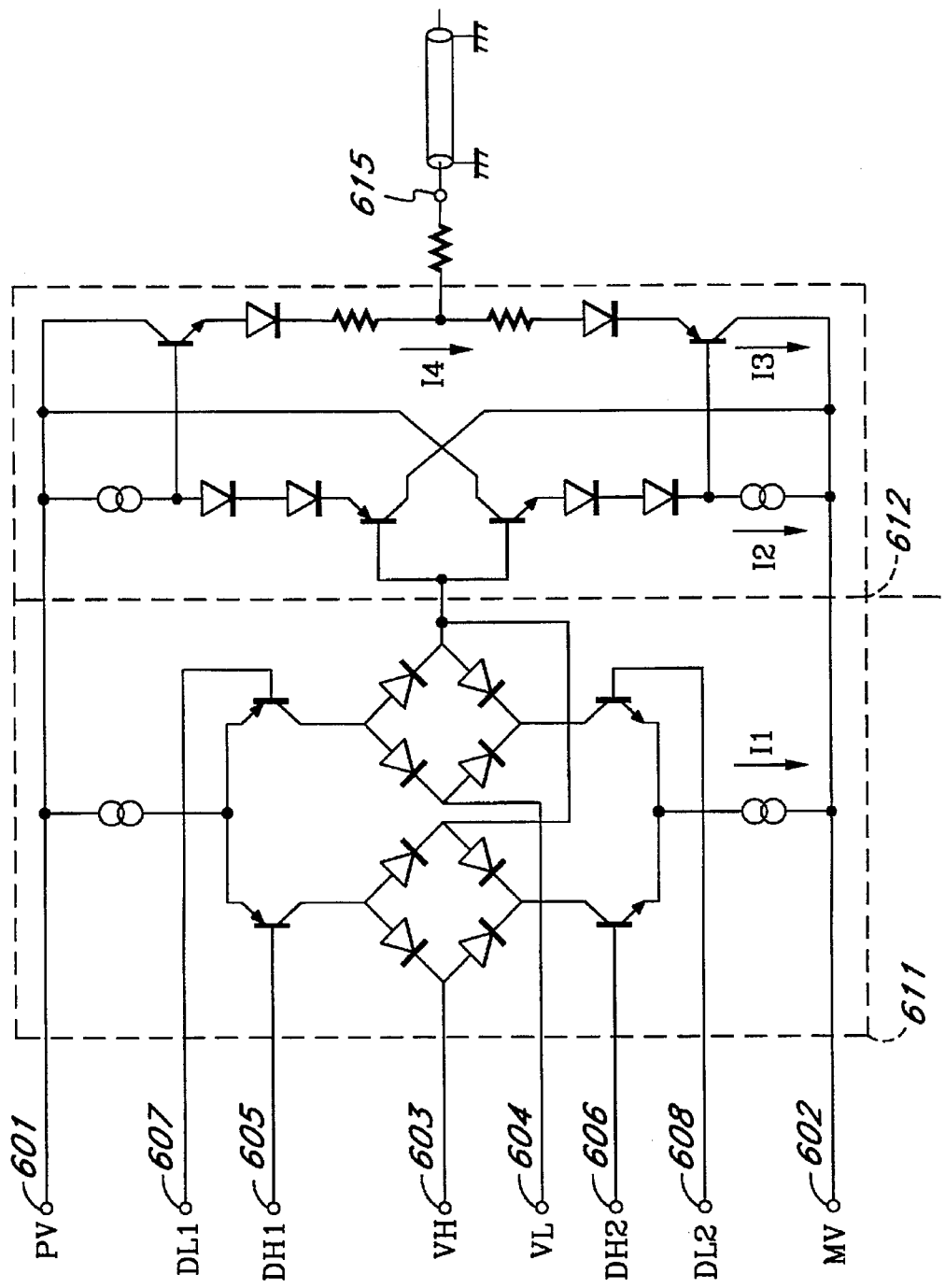
FIG. 11 is a conceptual schematic diagram illustrating a driver circuit used in the prior art.
Figure 12:
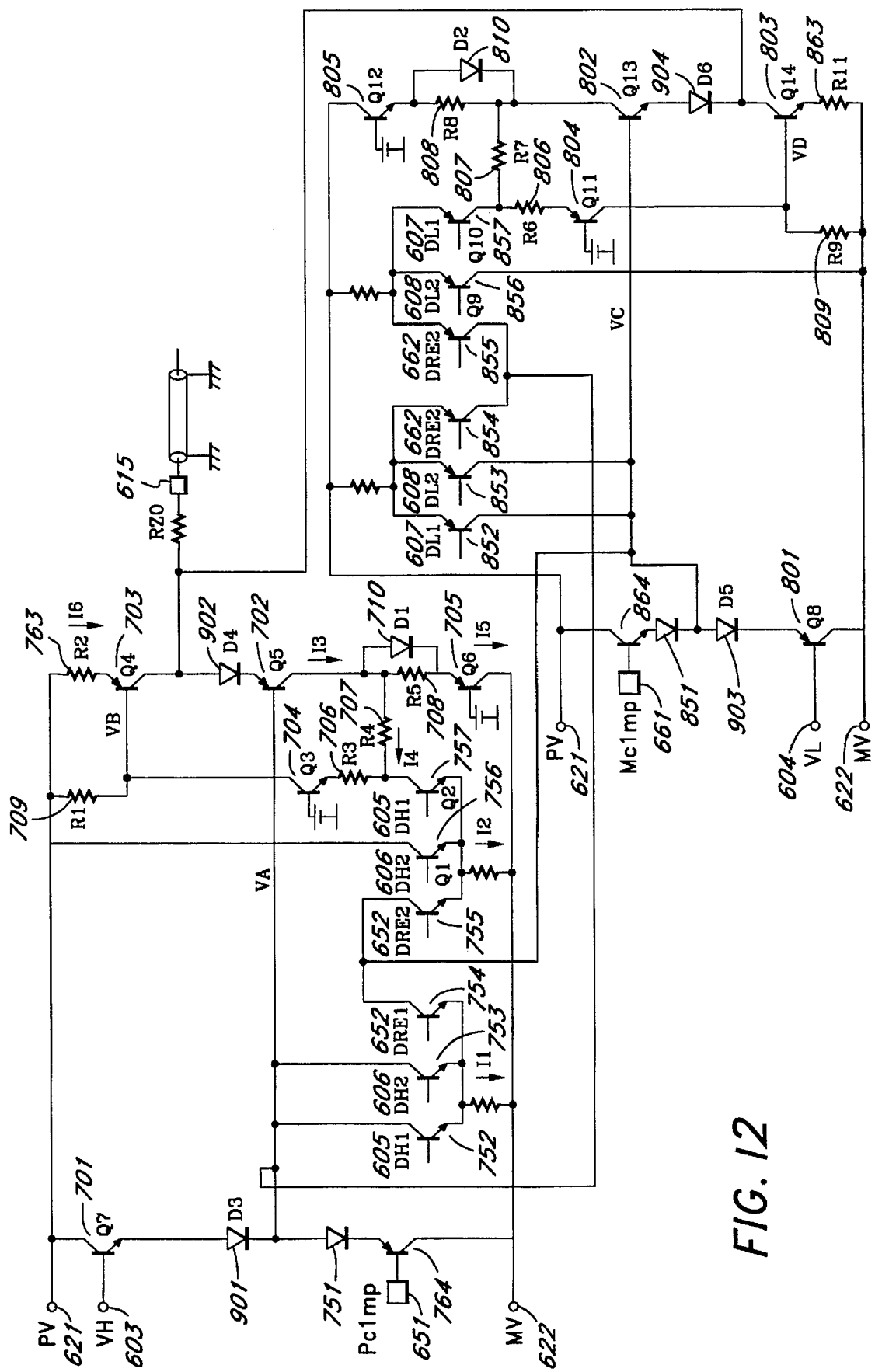
FIG. 12 is a schematic diagram illustrating an example of the driver circuit of the prior art, having the driver-inhibit function.

The level-shift circuit 400 has the same composition as the level-shift section 220 of the prior art circuit shown in FIG. 10. That is, after receiving PAT and NPAT signals of the ECL differential, the TCR signal for the rise-time control and the TFC signal for the fall-time control, the differential-switching signals Henb1, Lenb1 shifted to a positive-voltage level are supplied to the first driver circuit 500 and the second driver circuit 550. The differential-switching signals Henb2, Lenb2 shifted to a negative-voltage level are also supplied to the first driver circuit 500 and the second driver circuit 550.

The first driver circuit 500, as shown in FIG. 6, is composed of diode bridges (DB) 71 and 72, constant-current sections 501 and 502, switching sections 511, 512, and the output-driver section 520.

DB71 and DB72 are high-speed switches comprising bridges, each consisting of eight diodes. The output from these switches is taken from the tap position shifted by one diode-voltage Diode in order to provide voltage that is offset by a potential difference Vbe, which is a potential between the base and emitter of the output-stage transistors Q112 and Q113.

DB71 is a bridge comprising diodes D11–D14 and D15–D18. Current for switching is supplied by connecting the collector of PNP transistor Q83 to the anodes of D11 and D15. The analog-voltage signal VH is connected and supplied to the tap position shifted by one diode D16 voltage Diode. In other words, VH is connected to the base of Q112 from the cathode of D15 by current causing a sink by connecting the cathode of D14 and D18 to the collector of NPN transistor Q104.

DB72 is a bridge comprising diodes D21–D24 and D25–D28. Current for switching is supplied by connecting the collector of PNP transistor Q84 to the anodes of D21 and D25. The analog-voltage signal VL is connected and supplied to the tap position shifted by one diode D27 voltage Diode. In other words, VL is connected to the base of Q113 from the anode of D28 by current causing a sink by connecting the cathode of D24 and D28 to the collector of NPN transistor Q106.

In this example, the bridge comprises eight diodes but, alternatively, six diodes can be used by eliminating D14 and D18 or D21 and D25.

The constant current section 501 and constant current section 502 are the same as the prior art devices, and their purpose is to provide minute current in order to keep the potential across the DB71 or DB72, which are in an off stage, from becoming an indeterminate state. If both the ends are in a floating state, the high-speed switching may become troublesome during the next transitional operation. For this reason they are designed to prevent such an occurrence.

The switching section 511 receives positive differential-switching signals Henb1 and Lenb1 from the level shift-circuit 400. When Henb1<Lenb1, NPN transistor Q83 becomes conductive and supplies current i6 to DB71 in the forward direction. Conversely, when Henb1>Lenb1, the PNP transistors Q84 and Q85 become conductive and supply current i2 and I3 by resistor R74. Current i2 is supplied to DB72, providing a bias in the forward direction. Current i3 is supplied to the output-driver section 520 for biasing. Q84 and Q85 form a current mirror and the chip size is formed so that their current ratio is set, for example, to approximately 10:1.

The output-driver section 520 is composed of Q112, Q107 with a NPN current mirror formation, Q113, Q108 with a PNP current-mirror formation, and diode D7. The negative power supply VEX2 is connected to the collector of Q113. It is then transmitted to the output terminal out1 by connecting both emitters of Q112 and Q113. An input terminal at point A is connected to the base and collector of Q107, base of Q112, and cathode of D7. An input terminal at point B is connected to the base and collector of Q108, base of Q113, and anode of D7. A potential for biasing at the output stage is formed by connecting the emitter of Q107 to the emitter of Q108. Here, diode D7 is provided to prevent a degradation of the output-stage path by an application of unexpected abnormal voltages from the output terminal out1 side. The diode D7 can be eliminated if desired.

Each pair of Q107 and Q112 or Q108 and Q113 forms a current mirror and the chip size is arranged so that each current ratio is set to, for example, 1:6. As a result, currents i12 and i13 flow at the ratio of one to six. If each current-amplification factor of the transistors is denoted as hfe and the base current of Q107 is denoted as ib, ib=i3/(1+hfe+6). The emitter current i12 of Q107=ib×(1+hfe) and the emitter current i13 of Q112=6×ib×(1+hfe). Hence, a constant current which is biased to the A-class operating condition determined by the collector current i14 of Q112=6×ib×hfe flows in Q112 and Q113 via this circuit connection.

The operation of the embodiment of FIG. 6 when in steady state is explained below for the case of the VL level output.

The DB72 side enters the on state when PNP transistors Q84, Q85 and NPN transistor Q106 become conductive. The VL level output is then supplied to point B and is buffered and output to the output terminal out1.

The current i2 flows into the diode bridge DB72 and transistor Q106, and switches DB 72 to an on state. As a result, a voltage having a level which is equal to the analog voltage signal VL minus the diode-voltage Diode is supplied to the base of PNP transistors Q108 and Q113. The emitter output of the output-stage PNP transistor Q113 is dropped by Vbe, and the VL voltage is output to the output terminal out1. Hence, the output is offset by the potential difference of diode D27, and a voltage equal to the analog-voltage signal VL is output at the output terminal out1.

The other minute current i3 is further divided into the base/collector current of Q107 and the base current of Q112. Current I12 then flows on the Q107 side while current i13 flows on the Q112 side. Currents i12 and i13 flow into PNP transistor Q108 and Q113 and then flow into transistor Q106 through D28 of DB72. As a result, a potential difference between points A and B provides a steady-state bias condition of the voltage 2xVbe determined by Q107 and Q108. Furthermore, the output stage Q112 forms a current mirror with Q107 while Q113 forms a current mirror with Q108. Therefore, a similar A-class operation bias condition is provided.

Operation of the embodiment of FIG. 6 when in steady-state is explained below for the case of the VH level output.

In this case, PNP transistor Q83 and NPN transistors Q104, Q105 become conductive, and the analog voltage signal VH is buffered and output to the output terminal out1.

At this time, DB71 becomes an on state and the VH voltage is supplied to point A. Other than this the operation of the embodiment of FIG. 6 with respect to the VH level output, it is identical to the case described above of the first VL level output.

The operation of the embodiment of FIG. 6 in the transitional period when the output terminal out1 is switched from the VL to the VH level is explained below.

During the transitional period when the output terminal out1 reaches the VH level, the potential at point A decreases due to the potential of the out1 terminal. For this reason, DB71 becomes unbalanced and most of the current i6 flows into the point-A side through diode D15. Here, as the current i6 =10×i3, the base current, which is ten times greater than the current in the steady state, is supplied to the output stage Q112 and a large current is supplied to the output terminal out1. Soon, the potential at the out1 terminal becomes close to the VH, the current i6 is reduced and is returned to the original steady state, and the low-consumption current is restored. In this way, since there is no resistor in the output stage as with the prior art devices its drive ability becomes tenfold by a small potential difference in comparison to the steady state.

Operation of the embodiment of FIG. 6 in the transitional period when the output terminal out1 is switched from the VH to the VL level is explained below.

In this case, DB72 becomes unbalanced and most of the sink current i2 by Q106 flows into the diode D28 side. Hence, similar to the situation described above, the base current, which is ten times greater than the current in the steady state, is sunk in the output stage Q112. Accordingly, the driving ability at the output terminal out1 becomes tenfold by a small potential difference in comparison to the steady state.

In the above discussion of the second embodiment, the case of the composition with a two- branch driver circuit was explained. However, N sets of the driver circuit 500 with the composition of an N-branch driver circuit such as no branch, three branches, four branches, etc., can be arranged and implemented as described, if desired.

In addition, as explained in the case of inputting the PAT and NPAT of the ECL differential pattern, the pattern signal of a single input instead of the differential input is acceptable, and the TTL level instead of the ECL level is also acceptable.

In the prior discussion of the second embodiment, a current ratio of the current mirror between Q84 and Q85 or Q104 and Q105, 10:1 was used as an example of the chip-size ratio. However, the ratio can be M:1 if desired and can be similarly implemented. In addition, a current ratio of the current mirror between the output stage Q107 and Q112 or Q108 and Q113, 1:6 was used as an example of the chip-size ratio. However, this ratio can be 1:P if desired and can be similarly implemented.

In the discussion of the second embodiment, the transistors Q84 and Q85 or Q104 and Q105 of the switching sections 511 and 512 are arranged with a current mirror to provide a current ratio. However, the circuit can also or alternatively have a resistor on the emitter side to provide a current ratio.

In the discussion of the second embodiment, in the circuit of the level-shift circuit 400, a case using the TCR signal for rise-time control and the TFC signal for fall time control was explained. However, use of these signals can be eliminated if desired.

Figure 7A:
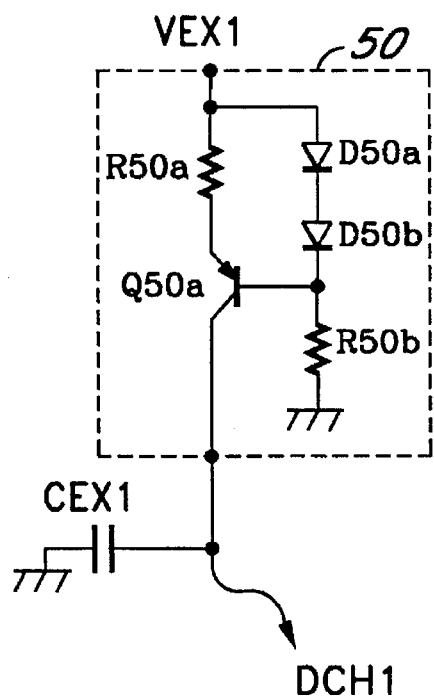
FIG. 7A is a schematic diagram illustrating a current-limiting circuit on the positive power-supply side of the second embodiment of this invention.
Figure 7B:
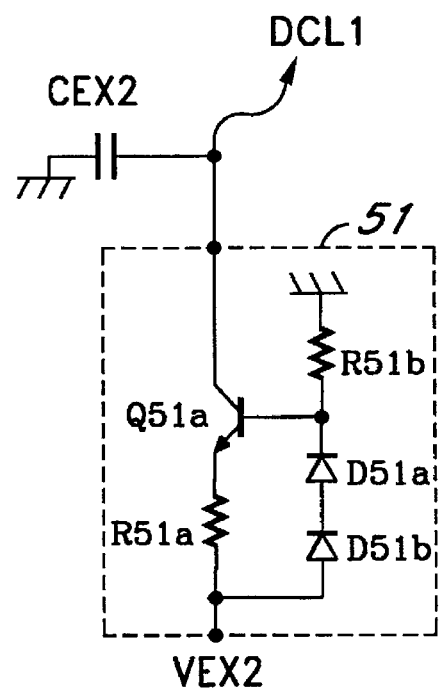
FIG. 7B is a schematic diagram illustrating a current-limiting circuit on the negative power-supply side of the second embodiment of this invention.
Figure 8:
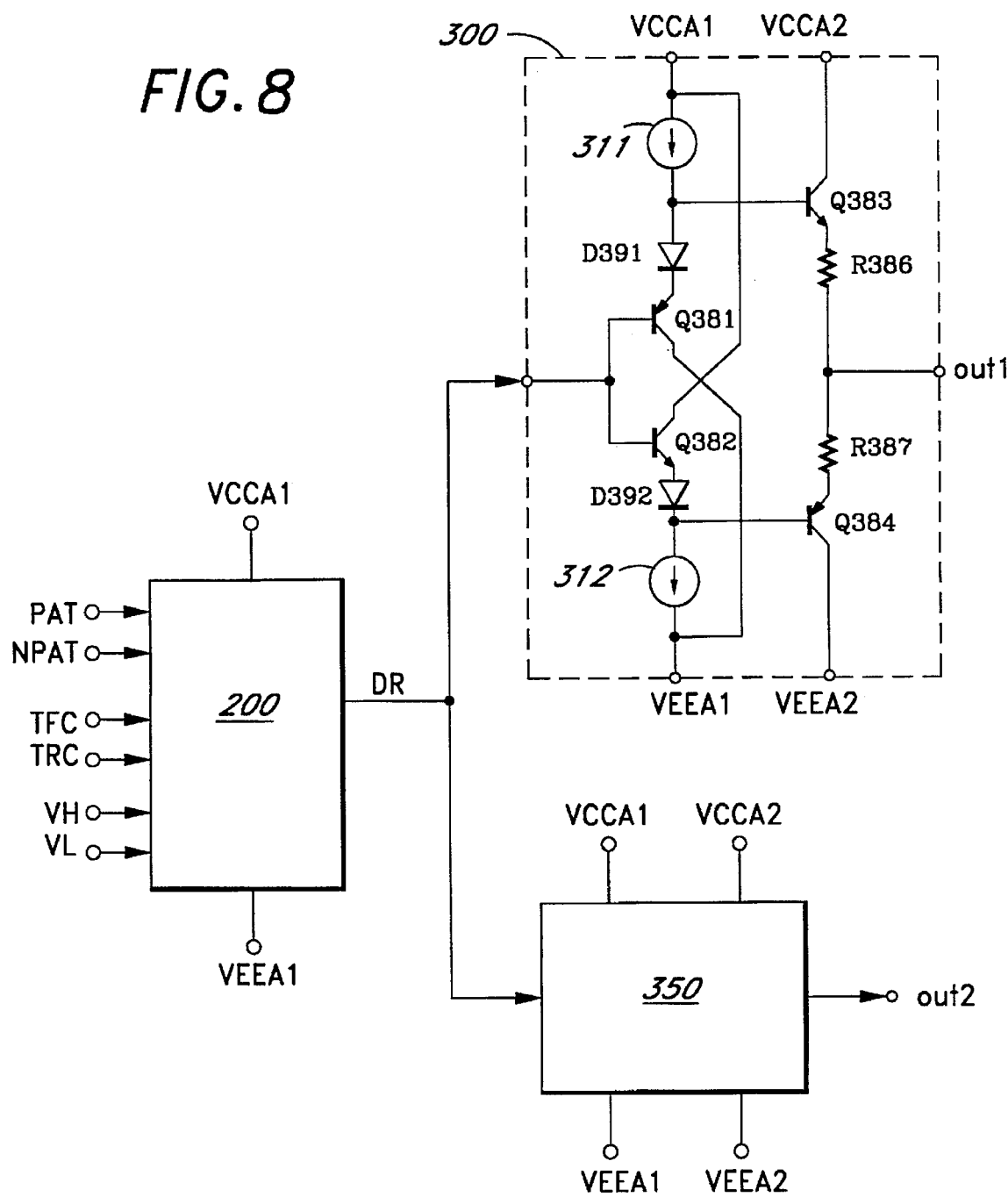
FIG. 8 is a block diagram illustrating a prior art two-branch driver circuit.
Figure 9:
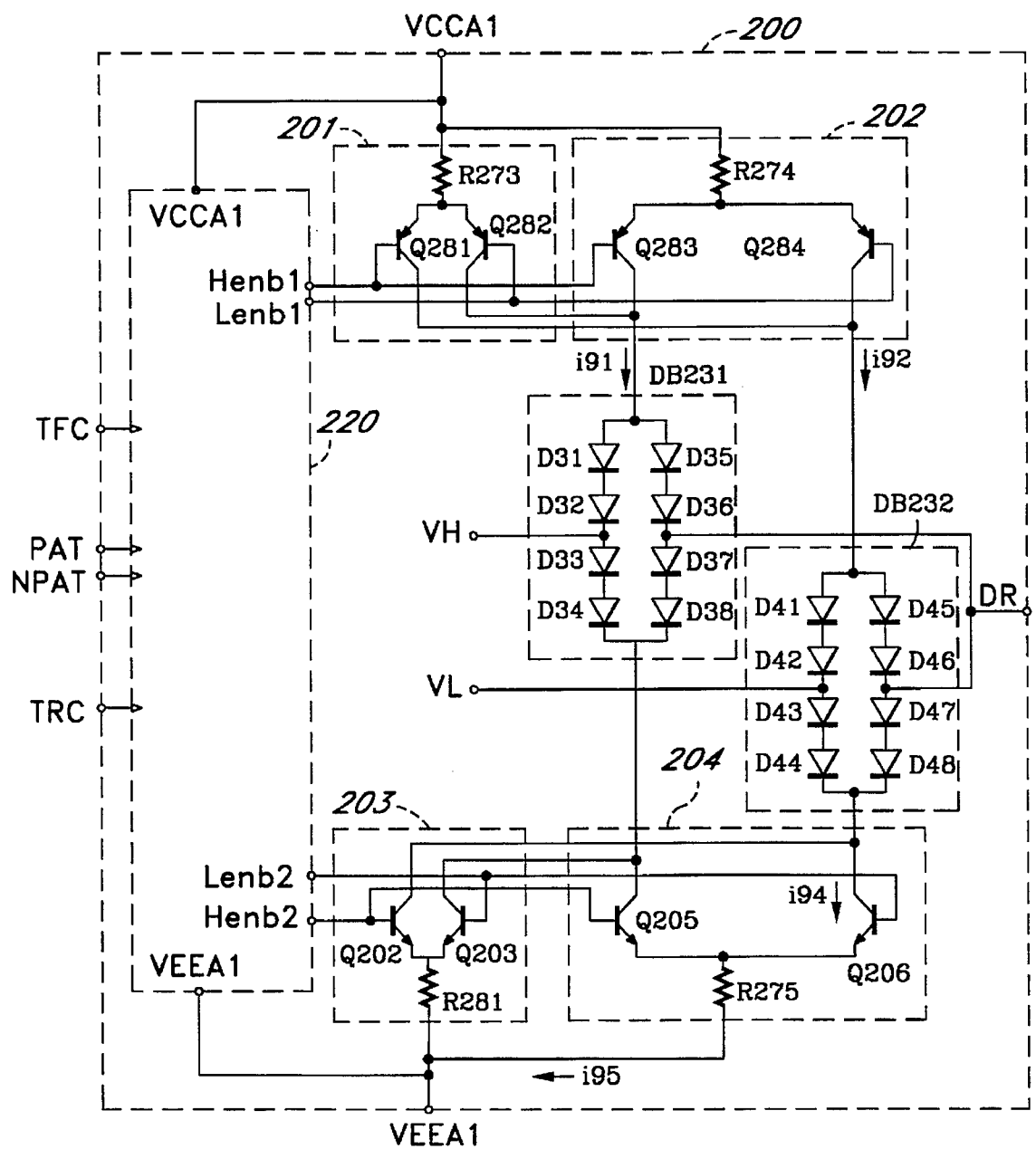
FIG. 9 is a schematic diagram illustrating a prior art level-conversion circuit.

In the discussion of the second embodiment, a case where the collector of the output stage Q112 was directly connected to the positive power supply VEX1 and the collector of Q113 was directly connected to the negative power supply VEX2 was explained. However, a current-limiting circuit can be added to prevent the output terminal out1 from shorting other power-supply terminals, etc., and causing circuit failures. In particular, the current-limiting section 50 in FIG. 7A arranged between the collector of the output stage transistor Q112 and power supply VEX1 is one example, and the current limiting section 51 in FIG. 7B arranged between the collector of the output stage transistor Q113 and power supply VEX2 is another example.

In the above discussion of the second embodiment, a scenario having constant current sections 501, 502 was explained. However, a minute current can be fed to a high-value resistor in place of the constant-current sections 501, 502 if desired and similarly implemented. In addition, the invention can be provided without the constant current sections 501, 502 if desired.

The effects produced by the second embodiment, configured as has been described, are discussed below.

In particular, this embodiment of the invention has the effect of gaining a bias potential of 2xVbe by connecting the base and collector of NPN transistor Q107 or NPN transistor Q108 of the output driver section 520, connecting both the emitters together, and feeding the constant current I3. Furthermore, as Q112 and Q107 or Q113 and Q108 form a current mirror, it has the effect of forming the A-class bias condition on output-stage transistors Q112 and Q113.

During the transitional period when the output terminal out1 has not reached the VH/VL levels, the potential at either point A or B decreases due to the potential of the out1 terminal. For this reason, DB71, DB72 connected to either point A or B become unbalanced and the current I6 or I4 flows in the direction of driving the output-stage transistor. As a result the invention as configured in the second embodiment has the effect of providing an ability to source and sink the load with a current that is M times greater than the steady state.

Because of these results, this circuit can reduce the consumed current in the steady state during no loads by one-third to one-fifth and it can source or sink the drive current similar to the traditional circuit during the transitional period of the output voltage. As a result, it can realize the driver circuit with significantly reduced power consumption. Due to this low power consumption, it also has the advantage of being able to house this monolithic IC in an inexpensive plastic package.

Figure 3:
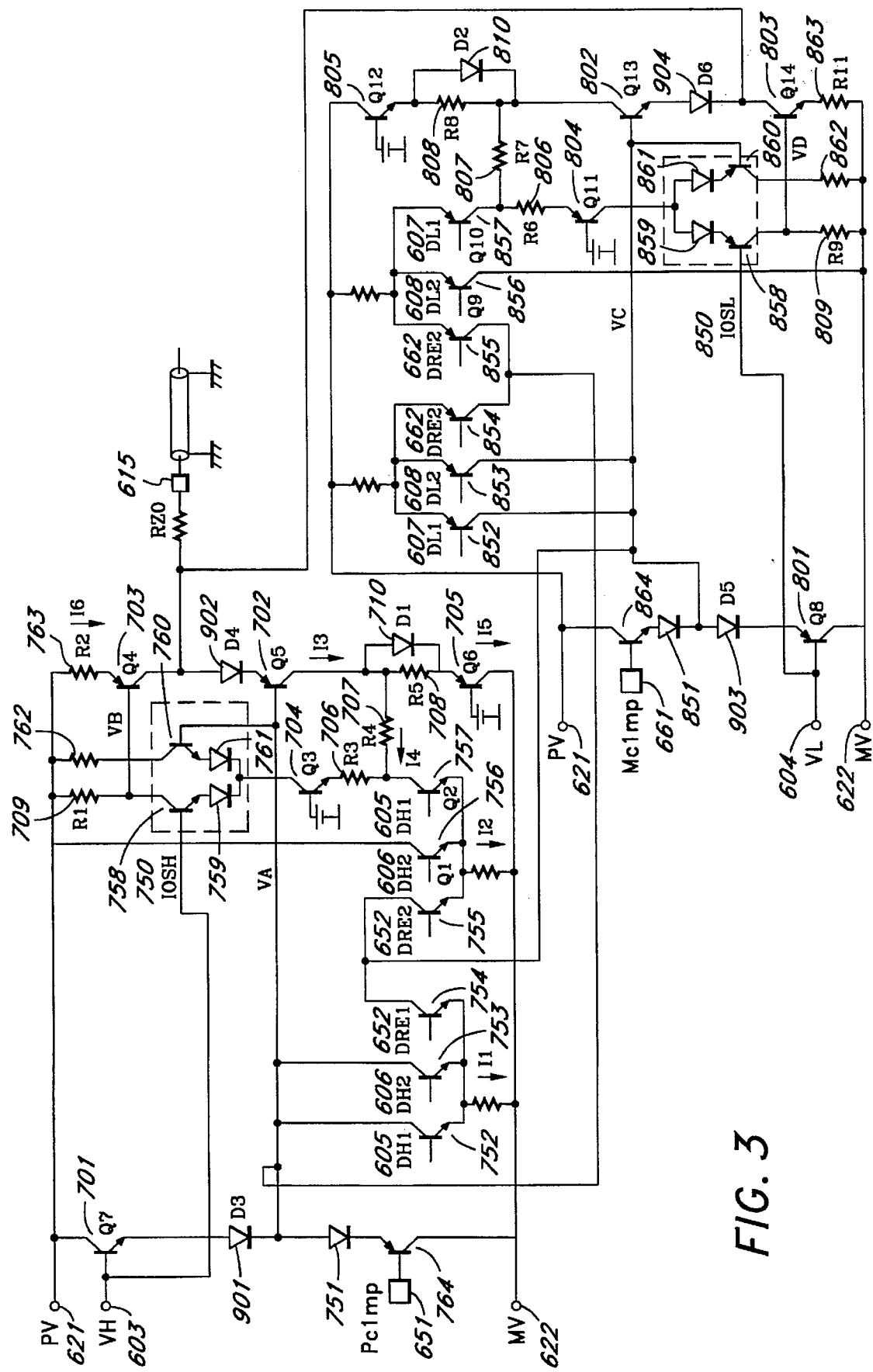
FIG. 3 is a schematic illustrates of a driver circuit of the third embodiment of this invention.
Figure 4:
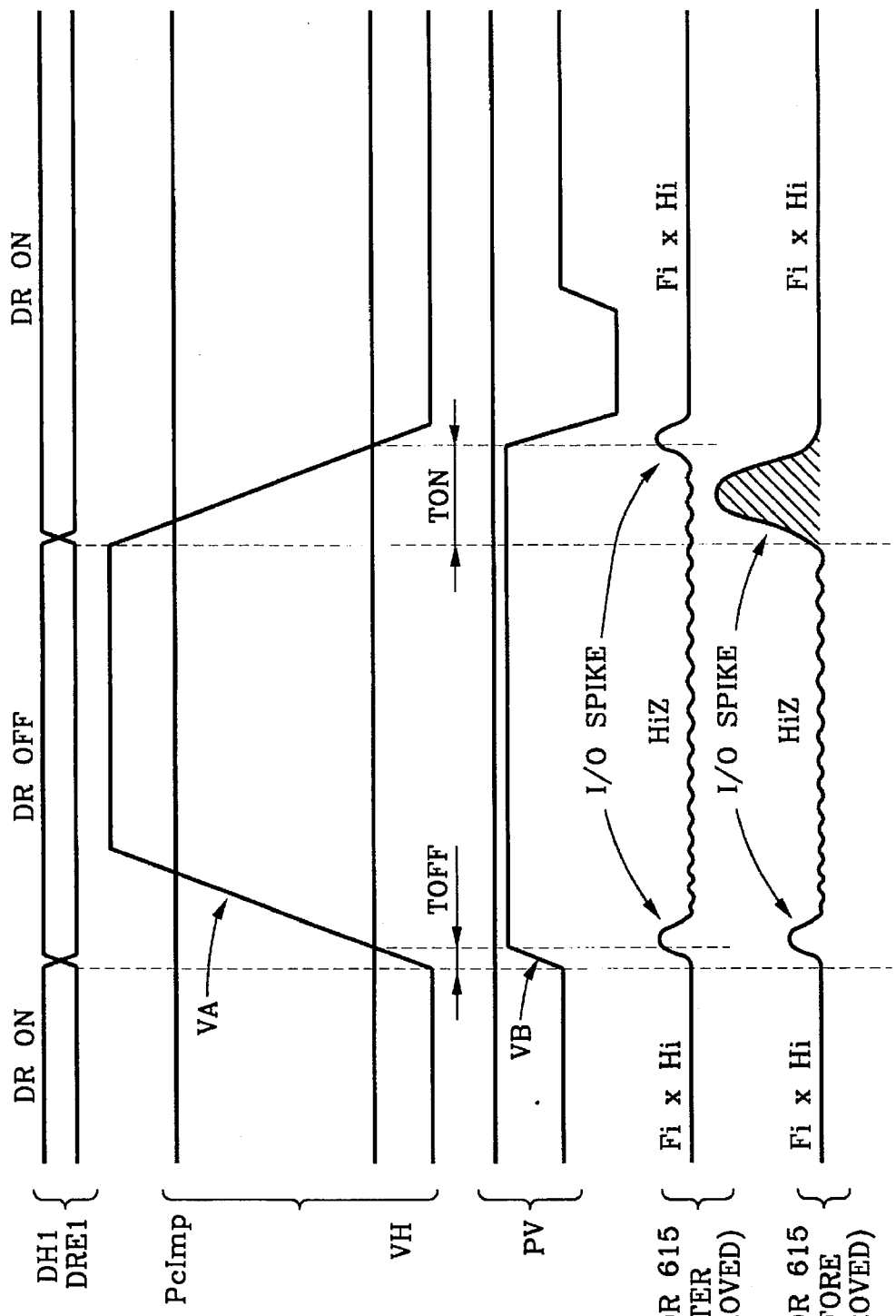
FIG. 4 is a timing diagram illustrating operational aspects of the third embodiment of this invention.

The third embodiment of this invention is best described by referring to FIGS. 3 and 4.

In particular, the third embodiment of this invention defines a configuration wherein an I/O spike reduction circuit is provided in the driver circuit with driver inhibit capability. Referring to FIG. 3, the driver circuit of the third embodiment of this invention is illustrated.

The VH side will first be described. It is noted that a similar operation is also performed on the VL side. Switching devices (transistors 758, 760) are connected to a stage of the current-source device 703 supplying the output current. Transistors 758 and 760 form a common emitter circuit. The high-level input voltage VH603 is applied to the base of transistor 758 while output from the voltage-buffer device 701 is applied to the base of transistor 760. The collector of transistor 758 is connected to the load resistor 709. The common emitter of transistor 758 and 760 is connected to the base-grounded transistor 704.

Note that Schottky barrier diodes (759, 761) can be inserted in the emitters of transistor 758 and 760 in order to protect breakdown voltage in the base and emitter. As configured, transistor 758 and 760 perform the following switching operations'.

If the current from transistor 704 is set so that the current-source device 703 becomes on, transistors 758 and 760 prohibit the current from flowing through the load resistor 709 until a certain condition is met. This condition is such that the input voltage VA of the voltage output device 702 becomes lower than the high-level input voltage VH. As shown in the time chart of FIG. 4, during the inhibit mode, the input voltage VA of the voltage-output device 702 is lifted to the clamp voltage Pclmp. When the inhibit mode is switched to the driver-on state, the voltage VA descends to the high-level input voltage VH, and during this period it prohibits the current-source device 703 from turning on. After the transitional time Ton, the switching devices (758, 760) in the I/O spike-reduction circuit meet the condition and the current-source device 703 is turned on. Thereafter, the driver output 615 is output from the voltage output device 702 and the inhibit mode is switched to the normal driver-output mode.

In this way, when the current source device 703 is turned on, the input voltage VA of the voltage-output device 702 is sufficiently dropped to the high-level input voltage VH from the clamp voltage Pclmp. Hence, a spike width of the driver-output voltage appearing as the I/O spike is drastically reduced as shown in FIG. 4d, in comparison with the traditional technology shown in FIG. 4e.

The third embodiment of this invention, configured as described and illustrated, has the following effects.

The switching devices (758, 760) are arranged in the preceding stage of the current-source device 703 supplying the output current. They prohibit the current-source device 703 from turning on until the input voltage VA of the voltage-output device 702 becomes lower than the high-level input voltage VH. During the inhibit mode, the input voltage VA of the voltage-output device 702 is lifted to the clamp voltage Pclmp. When the inhibit mode is switched to the driver-on state, the voltage VA descends to the high-level input voltage VH, and during this period it prohibits the current-source device 703 from turning on.

In this way, when the current-source device 703 is turned on, the input voltage VA of the voltage-output device 702 is sufficiently dropped to the high-level input voltage VH from the clamp voltage Pclmp. Hence, a spike width of the driver-output voltage appearing as the I/O spike is drastically reduced in comparison with the traditional technology.

The invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

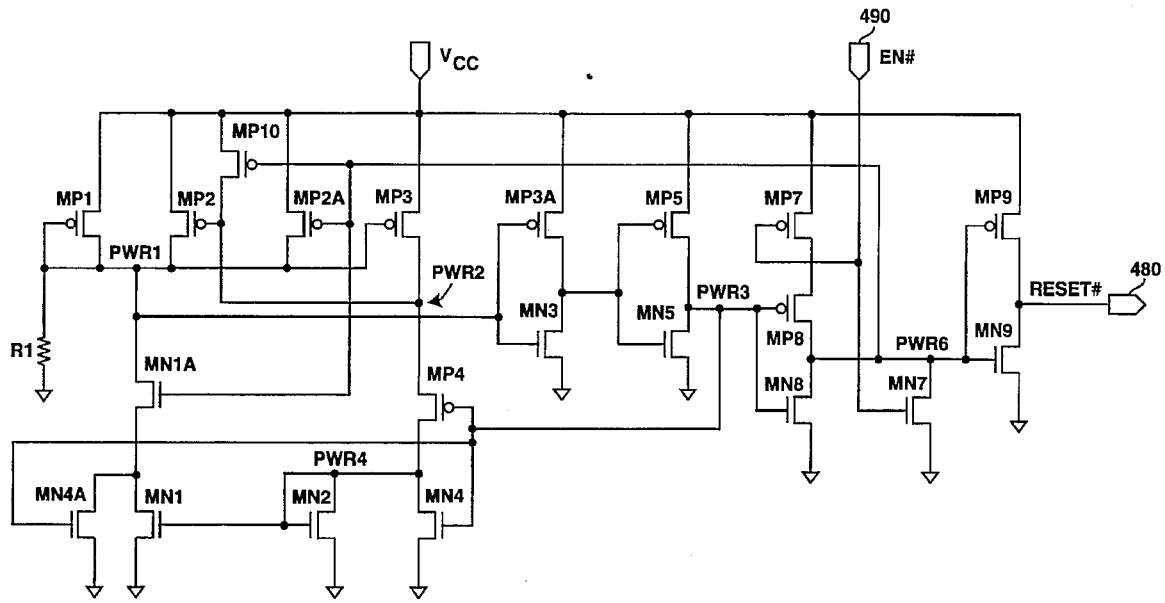

What is claimed is:

1. A low power consumption driver circuit for a semiconductor test system, comprising:

a high level amplifier (613) for determining a high level voltage of a test signal to be applied to a device to be tested, said high level amplifier (613) including:

a high level input amplifier (Q1, Q2) for receiving an input test signal and activating said high level amplifier (613) during a period which said input test signal is in one logical state;

a high level output amplifier (703) for generating a high voltage test signal to be supplied to a device under test;

a high voltage buffer (701) which is provided with a high level reference voltage (603) which defines said high level voltage of said test signal;

a high voltage control circuit (702, 704, 709) which is provided with said high level reference voltage through said high voltage buffer (701) and said high voltage test signal from said high level output amplifier (703) for controlling said high voltage test signal to be equal to said high level reference voltage, said high voltage control circuit being connected to said high level input amplifier (Q1, Q2) such that said high voltage test signal is generated by said high level output amplifier (703) only when said input test signal is in said one logical state;

a low level amplifier (614) for determining a low level voltage of said test signal to be applied to said device to be tested, said low level amplifier (614) including:

a low level input amplifier (Q9, Q10) for receiving said input test signal and activating said low level amplifier (614) during a period which said input test signal is in the other logical state;

a low level output amplifier (803) for generating a low voltage test signal to be supplied to said device under test;

a low voltage buffer (801) which is provided with a low level reference voltage (604) which defines said low level voltage of said test signal; and a low voltage control circuit (802, 804, 809) which is provided with said low level reference voltage through said low voltage buffer (801) and said low voltage test signal from said low level output amplifier (803) for controlling said low voltage test signal to be equal to said low level reference voltage, said low voltage control circuit being connected to said low level input amplifier (Q9, Q10) such that said low voltage test signal is generated by said low level output amplifier (803) only when said input test signal is in said other logical state.

2. A low power consumption driver circuit as defined in claim 1, wherein outputs of said high voltage output amplifier (703) and said low voltage output amplifier (803) are commonly connected to said device to be tested and only one of said output amplifier provides said test signal to said device under test based on said input test signal.

3. A low power consumption driver circuit as defined in claim 1, wherein:

said high level input amplifier (Q1, Q2) is a differential amplifier having high level differential input terminals and said input test signal is applied between said high level differential input terminals; and said low level input amplifier (Q9, Q10) is a differential amplifier having low level differential input terminals and said input test signal is applied between said low level differential input terminals.

4. A low power consumption driver circuit as defined in claim 1, wherein said high voltage control circuit including:

a high voltage detection circuit (704, 705, 706, 707, 708) which detects changes in said high voltage test signal supplied to said device under test from said high voltage output amplifier (703); and a high level feedback-control circuit (704, 709) which controls an input voltage of said high level output amplifier (703) in response to said high voltage detection circuit such that said high level test signal becomes equal to said high level reference voltage.

5. A low power consumption driver circuit as defined in claim 1, wherein said low voltage control circuit including:

a low voltage detection circuit (804, 805, 806, 807, 808) which detects changes in said low voltage test signal supplied to said device under test from said low voltage output amplifier (803); and a low level feedback-control circuit (804, 809) which controls an input voltage of low level output amplifier in response to said low voltage detection circuit such that said low level test signal becomes equal to said low level reference voltage.

* * * * *

ABSTRACT
United States Patent [19]
Geannopoulos

[11] Patent Number: 5,654,656
[45] Date of Patent: Aug. 5, 1997

[54] POWER UP RESET CIRCUIT WITH THRESHOLD VOLTAGE SHIFT PROTECTION

[75] Inventor: George L. Geannopoulos, Portland, Oreg.

[73] Assignee: Intel Corporation, Santa Clara, Calif.

[21] Appl. No.: 617,960

[22] Filed: Mar. 18, 1996

[51] Int. Cl.$^6$ .................................................. H03K 17/22
[52] U.S. Cl. ........................ 327/143; 327/142; 327/198
[58] Field of Search ...................................... 327/142, 143, 327/198, 538, 530, 141, 214, 437

[56] References Cited

U.S. PATENT DOCUMENTS 5,111,067 5/1992 Wong et al. ............................ 327/143
5,523,709 6/1996 Phillips et al. ........................ 327/143

Primary Examiner—Timothy P. Callahan
Assistant Examiner—Dinh T. Le
Attorney, Agent, or Firm—Blakely, Sokoloff, Taylor & Zafman

[57] ABSTRACT

The reset circuit includes a first current mirror coupled to a first terminal of a power supply. A second current mirror is coupled to a second terminal of the power supply. First and second switches couple the first current mirror to the second current mirror. A threshold detector provides a first signal when a current differential between the first and second current mirrors exceeds a predetermined threshold. A first shunt shunts the first current mirror to the first terminal. A second shunt shunts the second current mirror to the second terminal. Buffering circuitry controls the first and second switches and the first and second shunts in response to the first signal. The buffering circuitry further provides a buffered reset signal from the first signal. The buffered reset signal transitions from a first level to a second level in response to the first signal. The switches and shunts reduce the biases on the threshold detector and current mirrors.

18 Claims, 4 Drawing Sheets